US009403412B2

(12) United States Patent
Kim et al.

(10) Patent No.: US 9,403,412 B2
(45) Date of Patent: Aug. 2, 2016

(54) METHOD OF RECOGNIZING TRAILER OF TRACTOR VEHICLE

(71) Applicant: HYUNDAI MOTOR COMPANY, Seoul (KR)

(72) Inventors: Jin-Gi Kim, Jeonju (KR); Hyuk Lee, Inchun (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 38 days.

(21) Appl. No.: 14/531,954

(22) Filed: Nov. 3, 2014

(65) Prior Publication Data
US 2015/0183284 A1 Jul. 2, 2015

(30) Foreign Application Priority Data

Dec. 31, 2013 (KR) .......................... 10-2013-169383

(51) Int. Cl.
*G01R 19/15* (2006.01)
*B60D 1/24* (2006.01)
*G01R 19/00* (2006.01)
*G01R 31/00* (2006.01)

(52) U.S. Cl.
CPC .............. *B60D 1/24* (2013.01); *G01R 19/0092* (2013.01); *G01R 19/15* (2013.01); *G01R 31/006* (2013.01); *G01R 31/007* (2013.01)

(58) Field of Classification Search
CPC .............. B60D 1/24; B60D 1/28; B60D 1/36; B60D 1/62; B60D 7/00; B60D 1/58; B62D 27/00; B62D 53/00; B62D 53/08; B62D 53/10–53/12; B60Y 2300/28; G01R 19/003; G01R 19/0038; G01R 19/0046; G01R 19/145–19/15; G01R 19/16533; G01R 19/0092; G01R 31/006; G01R 31/007

USPC .......... 701/36, 48, 50, 29.1, 33.5, 33.7, 34.2, 701/34.4; 340/431, 686.1, 687, 686.2, 679, 340/988; 280/656, 407, 407.1, 423.1, 280/425.1, 425.2, 789; 324/504
See application file for complete search history.

(56) References Cited

U.S. PATENT DOCUMENTS

| 4,614,356 | A  | * | 9/1986  | Mills    | B60D 1/36 280/477 |
| 6,535,113 | B1 | * | 3/2003  | Gravolin | B60T 17/22 307/10.8 |
| 9,014,871 | B2 | * | 4/2015  | Luebke   | G08G 1/017 340/431 |
| 2006/0038381 | A1 | * | 2/2006 | Gehring | B60D 1/36 280/477 |
| 2006/0085099 | A1 | * | 4/2006 | Burlak  | B60D 1/62 701/1 |
| 2007/0152802 | A1 | * | 7/2007 | Knoll   | B60D 1/36 340/431 |
| 2007/0241869 | A1 | * | 10/2007 | Kalous | B60Q 1/305 340/431 |

(Continued)

FOREIGN PATENT DOCUMENTS

| JP | 7-257345 A    | 10/1995 |
| JP | 2000-127848 A | 5/2000  |
| WO | 2007/025136 A1 | 3/2007 |

*Primary Examiner* — Bao Long T Nguyen
(74) *Attorney, Agent, or Firm* — McDermott Will & Emery LLP

(57) ABSTRACT

A method of recognizing a trailer of a tractor vehicle by an electronic control unit (ECU) includes determining whether a parking switch is in an on state and a transmission gear state is a parking state. Whether a stop lamp switch is in an on state and a state of a current flowing in the stop lamp of the trailer is in an on state are determined. A load current quantity of a load lamp is recognized, and whether the stop lamp is in an open state is determined. A mode to a trailer non-connection mode when the stop lamp is in an off state is determined.

13 Claims, 5 Drawing Sheets

(56) References Cited

U.S. PATENT DOCUMENTS

| | | | | |
|---|---|---|---|---|
| 2009/0072956 A1* | 3/2009 | Kalous | | B60Q 1/305 340/431 |
| 2010/0271189 A1* | 10/2010 | Miller | | B60C 23/0408 340/431 |
| 2011/0254381 A1* | 10/2011 | Gramlich | | B60D 1/62 307/117 |
| 2012/0323443 A1* | 12/2012 | Risse | | B60D 1/62 701/36 |
| 2013/0027195 A1* | 1/2013 | Van Wiemeersch | | B60W 30/12 340/431 |
| 2013/0335988 A1* | 12/2013 | Rotenberg | | H01R 13/70 362/485 |
| 2014/0236420 A1* | 8/2014 | Brombach | | B60D 1/62 701/36 |

* cited by examiner

Fig. 2

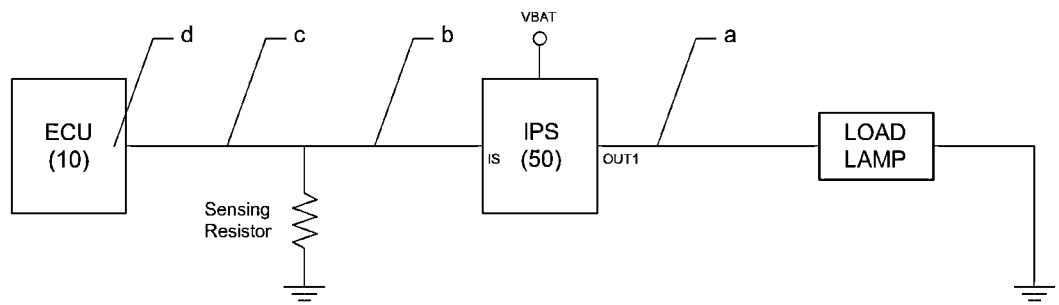

a: CALCULATE LOAD CURRENT: CALCULATE CURRENT FLOWING IN LAMP CONSIDERING LAMP TOLERANCE b: CALCULATE CURRENT OF IS TERMINAL OF IPS ACCORDING TO CURRENT SENSE RATIO
(RATIO OF LOAD CURRENT TO SENSING CURRENT)

c: DETERMINE VOLTAGE VALUE APPLIED TO MCU BASED ON VALUE OF SENSING RESISTOR
$V = I_{is}$ (Sensing Current) x $R_{sense}$ (Sensing Resistor)

d: CONVERT VOLTAGE VALUE INTO MCU RECOGNITION VALUE (AD Conversion)

METHOD OF RECOGNIZING TRAILER OF TRACTOR VEHICLE

CROSS-REFERENCE TO RELATED APPLICATIONS

This application claims the benefit of priority under 35 U.S.C. §119 to Korean Patent Application No. 10-201-169383, filed on Dec. 31, 2013, in the Korean Intellectual Property Office, the disclosure of which is incorporated herein by reference in its entirety.

TECHNICAL FIELD

The present disclosure relates to a method of recognizing a trailer of a tractor vehicle, and more particularly, to a method of recognizing a trailer, which recognizes a load current quantity flowing in a load lamp, such as a stop lamp and a left side turn signal lamp of the trailer, by using an intelligent power switch (IPS) element mounted in a smart junction box (SJB) of a tractor.

BACKGROUND

In general, a tractor refers to a vehicle hauling a trailer which is connected to the rear of the vehicle to travel.

A turn signal lamp is mounted on the tractor according to the automobile safety laws, and it is safety signal equipment that helps other vehicles accurately recognizing the tractor having a trailer turning.

When the turn signal lamp is disconnected, in order to notify a failure of the turn signal lamp, the turn signal lamp warns a driver of the disconnection of the turn signal lamp by flickering a signal of an instrument panel of the tractor at a speed of 120 to 250 times per minute, that is more than 85 times per minute in a normal state.

However, even in the case where the trailer is not connected to the rear of the tractor, an electronic control unit (ECU) of the tractor may misjudge the non-connection state of the trailer as the disconnection of the turn signal lamp to notify the failure.

Demand exists for development of a method of accurately notifying a driver of whether a trailer is connected in order to prevent the driver from recognizing a non-connection state of the trailer as a disconnection of a turn signal lamp. Among publicly known technologies in order to provide the aforementioned function in the related art, there is a technology of constructing an air detection switch in an air line, which supplies air to the trailer, and determining whether the trailer is coupled through the air detection switch. A technology of recognizing, by the ECU, whether the trailer is coupled by adding a pull-down resistor and a detection circuit to a trailer lamp channel circuit is available. However, the aforementioned technologies require additional cost for constructing the air detection switch, and the full-down resistor and the detection circuit, thereby increasing the production cost.

SUMMARY

The present disclosure has been made in an effort to provide a method of recognizing a trailer, which is capable of accurately recognizing whether the trailer is connected by using software without additionally constructing hardware like the related art.

According to an exemplary embodiment of the present disclosure, a method of recognizing a trailer of a tractor vehicle includes recognizing a load current quantity flowing in a load lamp, such as a stop lamp and a left side turn signal lamp of the trailer, by using an intelligent power switch (IPS) element mounted in a smart junction box (SJB) of a tractor.

According to an exemplary embodiment of the present disclosure, a method of recognizing a trailer of a tractor vehicle by an electronic control unit (ECU) includes determining whether a parking switch is in an on state and a transmission gear state is a parking state. When it is determined that the transmission gear state is not the parking state, whether a stop lamp switch of the trailer is in an on state and whether a state of a current flowing in a stop lamp of the trailer to determine whether the stop lamp is in an on state are determined. A hold state of a diagnosis of whether the trailer is connected is released when the stop lamp switch of the trailer is in the on state and the stop lamp is in the on state. A load current quantity of a load lamp is recognized and whether the stop lamp is in the open state is determined. A mode is determined as a trailer non-connection mode when the stop lamp is in an off state. According to the method of recognizing a trailer of a tractor vehicle of the present disclosure including the aforementioned configuration, it is possible to accurately recognize whether the tractor is connected only with software without mainly an additional configuration of a hardware circuit like the related art, thereby reducing production cost, and accurately recognizing whether the trailer is connected by using a comparatively simple logic.

BRIEF DESCRIPTION OF THE DRAWINGS

FIG. 2 is a configuration diagram of a circuit for recognizing a load current quantity of a load lamp of the circuit for performing the method of recognizing a trailer according to the present disclosure.

DETAILED DESCRIPTION

Hereinafter, a configuration of a method of recognizing a trailer of a tractor vehicle according to the present disclosure will be described with reference to the accompanying drawings.

However, the disclosed drawings are provided as an example for fully transferring the spirit of the present disclosure to those skilled in the art. Therefore, the present disclosure is not limited to the drawings suggested below, and may be specified as other aspects.

The terminologies used herein have the same meanings that those skilled in the art generally understand, if not defined, and the detailed description of a related known function or configuration that may make the purpose of the present disclosure unnecessarily ambiguous will be omitted in the following description and accompanying drawings.

Figure 1:
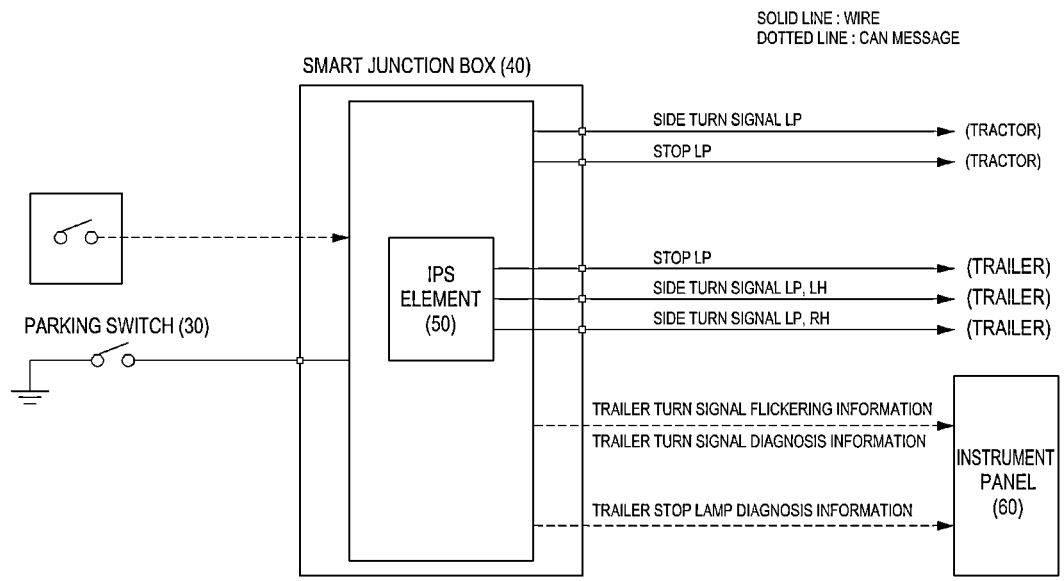
FIG. 1 is a configuration diagram of a circuit for performing a method of recognizing a trailer according to the present disclosure.

FIG. 1 is a configuration diagram of a circuit for performing a method of recognizing a trailer according to the present disclosure.

Referring to FIG. 1, a circuit for performing a method of recognizing a trailer according to the present disclosure recognizes a trailer by using an intelligent power switch (IPS) element 50 mounted in a smart junction box (SJB) 40, which is installed in a tractor and connected with an electronic control unit (ECU) 10 (see FIG. 2) and a parking switch 30, in order not to additionally construct hardware like the related art.

The SJB 40 is a modulated circuit for controlling driving of a side turn signal lamp and a stop lamp of the trailer, which performs input/output of various switches of the trailer.

The SJB 40 displays flickering information about a turn signal lamp of the trailer and diagnosis information about the turn signal lamp of the trailer and a stop lamp of the trailer on an instrument panel 60 of the tractor.

The IPS element 50 controls driving of a left side turn signal lamp LH a right side turn signal lamp RH, and the stop lamp of the trailer. The IPS element 50 is a power control semiconductor device which is generally used for controlling vehicle lamps, and elements based on ARISU Chip™ are widely used for the IPS element 50.

FIG. 2 is a configuration diagram of a circuit for recognizing a load current quantity flowing in a load lamp by the IPS element 50 in the circuit for performing the method of recognizing the trailer according to the present disclosure, which is configured as described above.

Referring to FIG. 2, an electronic control unit (ECU) 10 of a vehicle is connected with the IPS element 50, a sensing resistor R1 is constructed at an output side of the ECU 10 and an input side of the IPS element 50 in parallel. The load lamps, such as the left side turn signal lamp LH, the right side turn signal lamp RH, and the stop lamp of the trailer, are connected to an output side of the IPS element 50.

The current quantity recognition circuit calculates the load current quantity flowing in the load lamp by considering current tolerance of the load lamp at point a, calculates a current quantity flowing in the input side of the IPS element 50 according to a current sense ratio of the load current quantity flowing in the load lamp at point a to point b of sensing a current quantity flowing in the sensing resistor R1, and determines a voltage value applied to the ECU 10 by the value of the sensing resistor R1 at point c. That is, the voltage value is determined by using an equation below.

$V$ (voltage value at point $c$)=$I_{is}$ (sensing current)×resistance value of $R1$ The ECU 10 analog-digital converts the determined voltage value applied to the ECU 10 at point d.

Accordingly, the ECU 10 recognizes the current flowing in an input terminal of the IPS element 50 in proportion to the load current quantity flowing in the load lamp, thereby reversely recognizing a current quantity flowing in the load with the sensing voltage (a value of proportional constant K of the IPS element 50 is a predetermined value).

Figure 3:
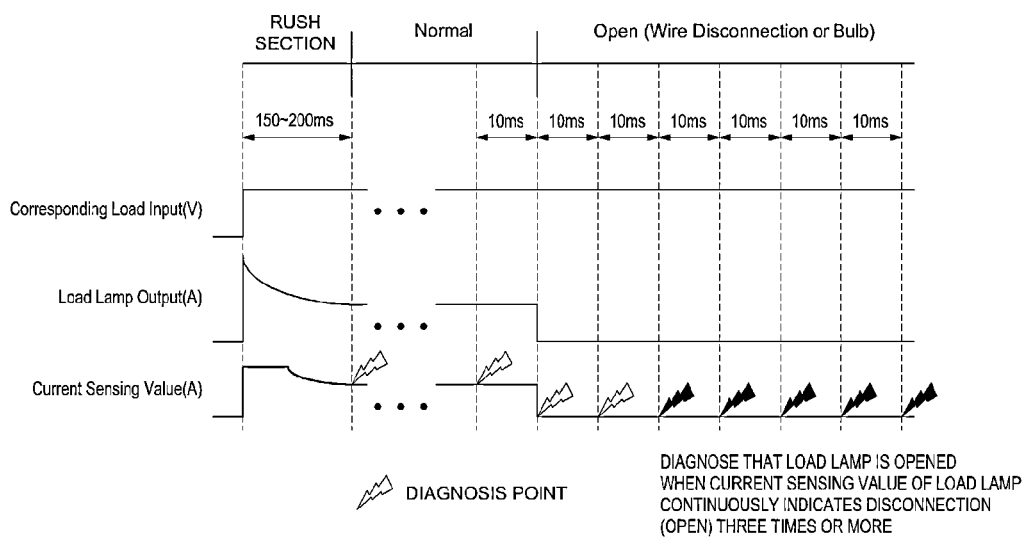
FIG. 3 is a timing chart of the circuit for recognizing a load current quantity of the load lamp of the circuit for performing the method of recognizing the trailer according to the present disclosure.

FIG. 3 is a timing chart by the circuit for recognizing the current quantity of the load lamp including the aforementioned configuration. When the load lamp is in an on state, the ECU 10 monitors the load current quantity of the load for every 10 ms, and determines that the load lamp is disconnected (opened) when a current sensing value of the load lamp continuously indicates a disconnection (open) three times or more. This is for the purpose of preventing even a temporal disconnection (open) of the load lamp by noise or surge from being misjudged as open of the load lamp.

Figure 4:
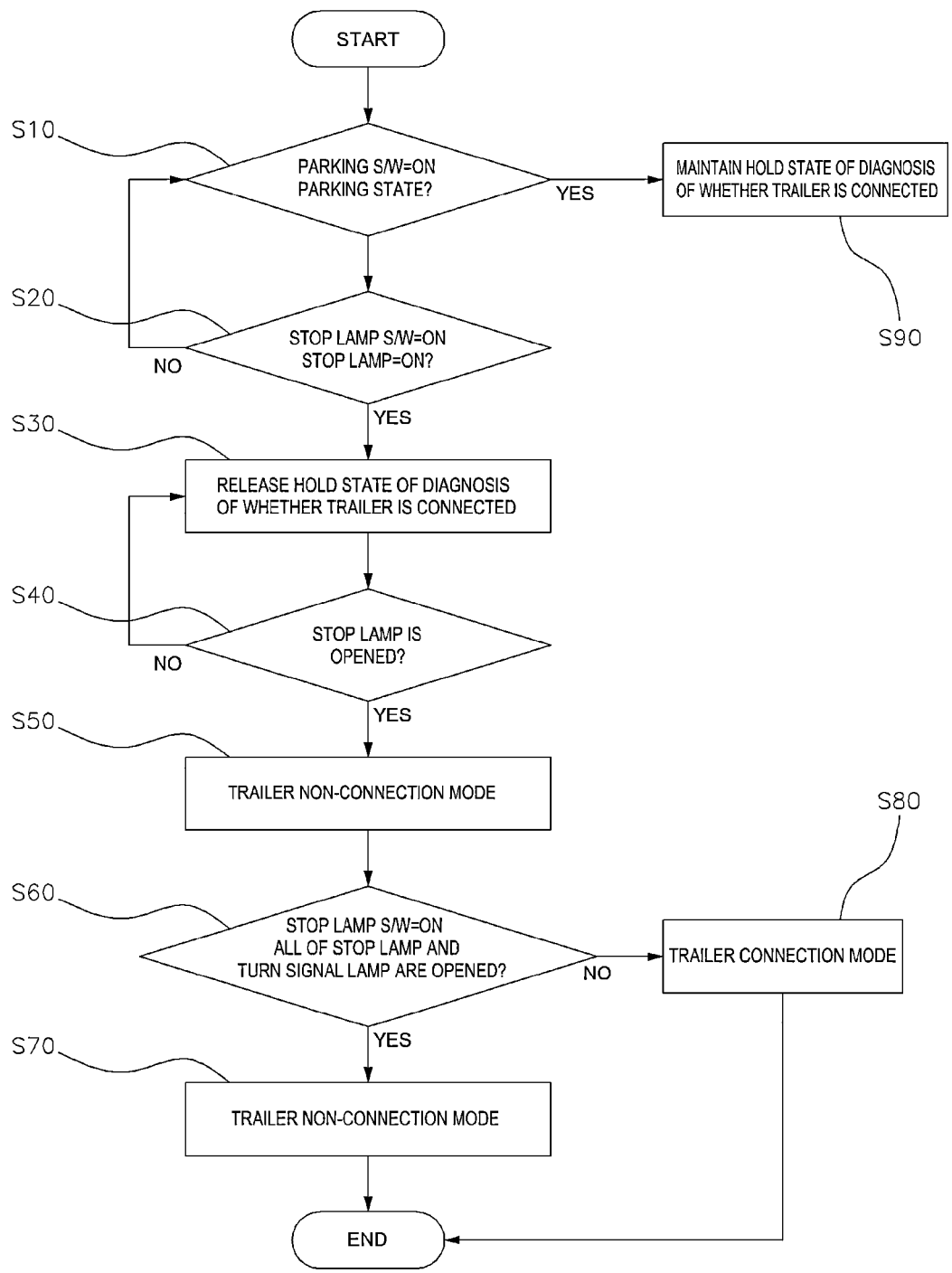
FIG. 4 is a flowchart illustrating the method of recognizing a trailer according to the present disclosure.

FIG. 4 is a flowchart illustrating the method of recognizing the trailer according to the present disclosure.

In the method of recognizing the trailer according to the present disclosure, the ECU 10 recognizes a load current quantity flowing in the load lamp by using the aforementioned circuit, and monitors a load current quantity flowing in the load lamp for every period of 10 ms.

The ECU 10 determines whether a parking switch is an on state, and the transmission gear state is a parking state (S10).

When the ECU 10 determines that the transmission gear state is not the parking state in step S10, the ECU 10 determines whether the stop lamp is in an on state by recognizing whether the stop lamp switch of the trailer is in an on state, and a current state flowing in the stop lamp of the trailer and diagnosing the stop lamp (S20).

When the stop lamp switch is in the on state, and the stop lamp is in the on state in step S20, the ECU 10 releases a hold state of a diagnosis of whether the trailer is connected (S30) (that is, a diagnosis of whether the trailer is connected is started).

The ECU 10 performs the diagnosis of the stop lamp of the trailer by recognizing a load current quantity of the load lamp, which is described with reference to FIGS. 2 and 3, in step S30, to determine whether the stop lamp is in an open state (disconnection state) (S40).

When the stop lamp is in an off state in step S40, the ECU 10 determines a mode as a trailer non-connection mode (S50).

The ECU 10 performs the diagnosis of the stop lamp of the trailer and the turn signal lamp of the trailer by recognizing whether a stop switch of the trailer is in the on state during the driving of the turn signal lamp of the trailer, and the load current quantity of the load lamp, which is described with reference to FIGS. 2 and 3, to determine whether all of the stop lamp and the turn signal lamp are in the open state (S60).

When the stop switch of the trailer is in the on state, and all of the stop lamp and the turn signal lamp are in the open state in step S60, the ECU 10 determines the mode to the trailer non-connection mode (S70).

When the stop switch of the trailer is in the on state, and any one of the stop lamp and the turn signal lamp is not in the open state in step S60, the ECU 10 determines the mode to a trailer connection mode (S80).

When the parking switch is in the on state, and the transmission gear state is the parking state in step S10, the ECU 10 maintains the hold state of the diagnosis of whether the trailer is connected until the stop switch becomes the on state to maintain a value indicating whether the trailer is connected, which is previously diagnosed (S90).

Further, if the stop lamp is not in the open state in step S40, the ECU 10 repeats step 30 of releasing the hold state of the diagnosis of whether the trailer is connected.

Figure 5:
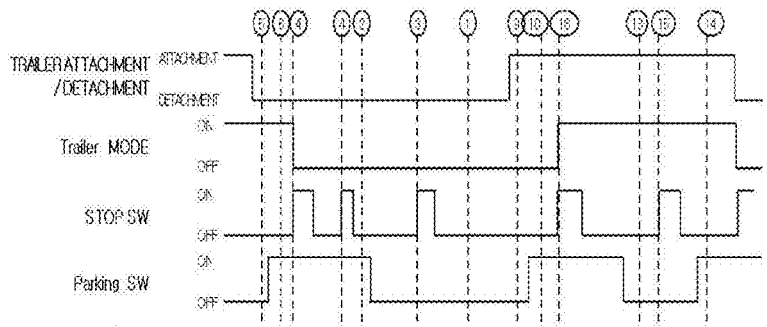
FIG. 5 is a table illustrating an operation for each situation of a recognition logic of a trailer by the method of recognizing a trailer according to the present disclosure.

FIG. 5 is a table illustrating an operation for each situation of a recognition logic of the trailer of the present disclosure according to the aforementioned flowchart of FIG. 4, and presents a determination result of the recognition logic of the trailer of the present disclosure according to an attachment/detachment signal of the trailer, the trailer connection/non-connection mode, and on/off of the stop lamp switch and the parking switch.

What is claimed is:

1. A method of recognizing a trailer of a tractor vehicle by an electronic control unit (ECU), the method comprising steps of:
    determining whether a parking switch is in an on state, and a transmission gear state is a parking state;
    determining whether a stop lamp switch of the trailer is in an on state, and a state of a current flowing in a stop lamp of the trailer to determine whether the stop lamp is in an on state when it is determined that the transmission gear state is not the parking state;

releasing a hold state of a diagnosis of whether the trailer is connected when the stop lamp switch of the trailer is in the on state and the stop lamp is in the on state;

recognizing a load current quantity of a load lamp and determining whether the stop lamp is in an open state; and determining a mode as a trailer non-connection mode when the stop lamp is in an off state.

2. The method of claim 1, wherein the steps of recognizing the load current quantity of the load lamp by the ECU includes recognizing the load current quantity flowing in the load lamp, including the stop lamp and a left side turn signal lamp of the trailer by using an intelligent power switch (IPS) element mounted in a smart junction box (SJB) of the tractor.

3. The method of claim 2, wherein the step of recognizing the load current quantity of the load lamp by the ECU includes monitoring, by the ECU, a current quantity of a load for every 10 ms when the load lamp is in the on state, and determining that the load lamp is disconnected when a current sensing value of the load lamp continuously indicates a disconnection by three times or more.

4. The method of claim 3, wherein the disconnection means open.

5. The method of claim 2, wherein the SJB displays flickering information about the left side turn signal lamp of the trailer and diagnosis information about the left side turn signal lamp and the stop lamp of the trailer on an instrument panel of the tractor, and the SJB is connected to the ECU.

6. The method of claim 2, wherein the IPS element is a power control semiconductor device.

7. The method of claim 2, wherein the ECU is connected with the IPS element, a sensing resistor is installed between an output side of the ECU and an input side of the IPS element.

8. The method of claim 2, wherein the left side turn signal lamp and the stop lamp of the trailer are connected to an output side of the IPS element.

9. The method of claim 1, after the step of determining the mode, further comprising steps of:

recognizing whether a stop switch of the trailer is in an on state during the driving of a turn signal lamp of the trailer, and the load current quantity of the load lamp to determine whether all of the stop lamp and the turn signal lamp of the trailer are in an open state; and determining the mode as the trailer non-connection mode when the stop switch of the trailer is in the on state, and all of the stop lamp and the turn signal lamp of the trailer are in the open state.

10. The method of claim 9, after the step of determining whether the parking switch is in the on state, further comprising a step of determining the mode as a trailer connection mode when the stop switch of the trailer is in the on state, and any one of the stop lamp and the turn signal lamp of the trailer is not in an open state.

11. The method of claim 9, after the step of recognizing whether the stop switch of the trailer is in the on state, further comprising a step of maintaining the hold state of the diagnosis of whether the trailer is connected until the stop switch is in the on state to maintain a value indicating whether the trailer is connected to the tractor, which is previously diagnosed, when the parking switch is in the on state and the transmission gear state is the parking state.

12. The method of claim 1, wherein the open state means a disconnection state.

13. A non-transitory computer-readable medium including instructions execution of which causes a controller to perform the steps of claim 1.

* * * * *